United States Patent
Yu-Chou et al.

(10) Patent No.: US 6,844,222 B2
(45) Date of Patent: Jan. 18, 2005

(54) METHOD FOR REDUCING CONTACT IMPEDANCE OF THIN FILM TRANSISTOR

(75) Inventors: Lee Yu-Chou, Taipei (TW); Chen Chiun-Hung, Yunlin (TW)

(73) Assignee: Chungwha Picture Tubes, Ltd., Taipei (TW)

( * ) Notice: Subject to any disclaimer, the term of this patent is extended or adjusted under 35 U.S.C. 154(b) by 0 days.

(21) Appl. No.: 10/465,016

(22) Filed: Jun. 18, 2003

(65) Prior Publication Data

US 2004/0259294 A1 Dec. 23, 2004

(51) Int. Cl.[7] .......................... H01L 21/00; H01L 21/84

(52) U.S. Cl. ........................................ 438/151; 438/149

(58) Field of Search ................................ 438/149, 151, 438/157, 166, 150; 257/66–72

*Primary Examiner*—Eddie Lee
*Assistant Examiner*—Douglas W. Owens
(74) *Attorney, Agent, or Firm*—Perkins Coie LLP

(57) ABSTRACT

The present invention relates to reduce contact impedance of a gate electrode of a thin film transistor (TFT). It employs a double layer of AlNd/Cr or AlNd/Cr silicide as a material of the gate electrode and employs plasma atmosphere to clean a contact surface of the gate electrode.

17 Claims, 1 Drawing Sheet

METHOD FOR REDUCING CONTACT IMPEDANCE OF THIN FILM TRANSISTOR

BACKGROUND OF THE INVENTION

1. Field of the Invention

This invention relates to a method of reducing a contact impedance between a gate electrode of a thin film transistor and a Indium Tin Oxide (ITO).

2. Description of the Prior Art

Nowadays, typical cathode ray tubes (CRTs) are made in larger size to provide users with better visual effect. Similarly, liquid crystal displays (LCDs) are also made as large in size as possible.

The LCD has the inherent advantages of low power consumption and less weight, over the CRT. Specifically, for those CRT products that are over 38" inches, they are much heavier than comparable LCD products. Further, large size CRT's are also more difficult to manufacture. Therefore, the LCD product has clearly become the better choice for customers in purchasing large-sized displays.

However, large size (more than 20") LCDs having a high resolution need a shorter RC delay time. In those conventional arts, materials of a thin film transistor (TFT) on a LCD are Al, Cr, W, Ta, Mo and so on. Because of AL having a higher electric conductivity (i.e.: the resistance R is lower), a gate electrode of the TFT is generally made of single-layer Al or double-layer of Al/Al alloy or Al alloy/other metals. For single layer Al, a layer of oxide will be generated on the surface of Al due to Al contacting air when the Al is moved from a vacuum chamber to proceed next step. The oxide layer can not be cleaned away with an etching liquid and so when Al layer is connected with other metal, the contact impedance between the Al layer and the other metal is very high. On the other hand, the double-layer structure made of a first metal layer 20 and a second metal layer 30 (e.g.: Al/Al alloy or Al alloy/other metals), as shown in FIG. 1 has difference etching rates resulted from different metal. Therefore an eaves structure will occur after etching process due to the two layers having different etching rate. Namely, two edges of the connecting part between the first metal 20 and the second metal 30 as shown in FIG. 1 have bulges. Therefore, some etched residual impurities will easily remain under the bulges and be hard to clean away. The following processes are influenced and the contact impedance and the impedance of the gate electrode of double-layer becomes bad. If the gate electrode is made of single-layer Cr or other metal, the contact impedance between the gate electrode and ITO is small but the impedance of the gate electrode is higher and so it can not achieve a shorter RC delay time.

Hence, the development of large size LCD must solve the problem of reducing the gate impedance and the contact impedance between the gate electrode and the other metal of the TFT.

SUMMARY OF THE INVENTION

In those conventional arts, the gate electrode of the TFT is made of single-layer Al or double-layer of Al/Al alloy or Al alloy/other metals and so the oxide and the etched residual impurities is generated to increase the gate electrode contact impedance and the gate impedance. On the other hand, the gate electrode made of Cr or other metal has smaller contact impedance but higher gate impedance. Therefore, the RC delay time can not be reduced. One of objectives of the present invention is to provide a method for reducing contact impedance of thin film transistor. The method employs a double-layer of AlNd/Cr or AlNd/Cr silicide as a material of the gate electrode and employs plasma to clean a contact surface of the gate electrode for reducing the contacting impedance between ITO layer and the gate electrode.

Another objective of present invention is to provide a method for reducing contact impedance of thin film transistor that the materials of the two layers have similar etching rate for reducing the effect of the generation of the eaves structure for the following processes and the electronic characteristic of the gate electrode.

Another objective of present invention is to provide a method for reducing contact impedance of thin film transistor for improving the RC delay time and the response time of LCD.

Another objective of present invention is to provide a method for reducing contact impedance of thin film transistor for achieving the purpose of that large size has a shorter RC delay time. As aforementioned, the present invention provides a method for reducing contact impedance of thin film transistor. The method comprises forming a metal conducting structure on a substrate, the metal conducting structure, and employing a plasma to clean surfaces of the metal conducting structure. Wherein, the forming method of the metal conducting structure comprises forming an AlNd layer on the substrate, and forming a Cr layer or a Cr silicide layer on the AlNd layer for providing a lower gate impedance. The contact impedance also can be reduced by employing a plasma to clean surfaces of the metal conducting structure whereby the AlNd layer and the Cr or Cr silicide layer are formed as a barrier layers.

Hence, in the conventional arts, the gate electrode of the TFT is made of single-layer Al or double-layer of Al/Al alloy or Al alloy/other metals has problems of a higher contact impedance and a higher gate impedance in the conventional arts or the gate electrode made of Cr or other metal has smaller contact impedance but higher gate impedance. The present invention provides a method for reducing contact impedance of thin film transistor and can avoid the problems in the conventional arts and can achieve the aforementioned advantages.

BRIEF DESCRIPTION OF THE DRAWINGS

The foregoing aspects and many of the attendant advantages of this invention will become more readily appreciated as the same becomes better understand by reference to the following detailed description, when taken in conjunction with the accompanying drawings, where in.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims.

Then, the components of the different elements are not shown to scale. Some dimensions of the related components are exaggerated and meaningless portions are not drawn to provide a more clear description and comprehension of the present invention.

Figure 1:
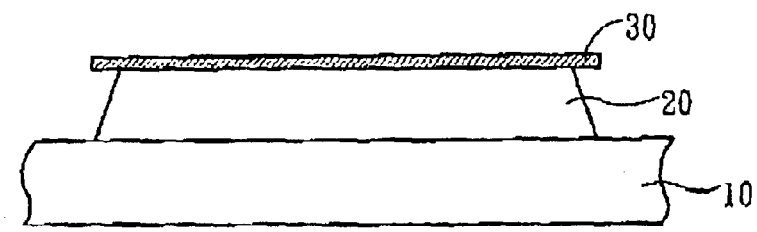
FIG. 1 is a schematic diagram of a gate electrode double-layer made of Al and other metal or Al alloy and other metal.
Figure 2:
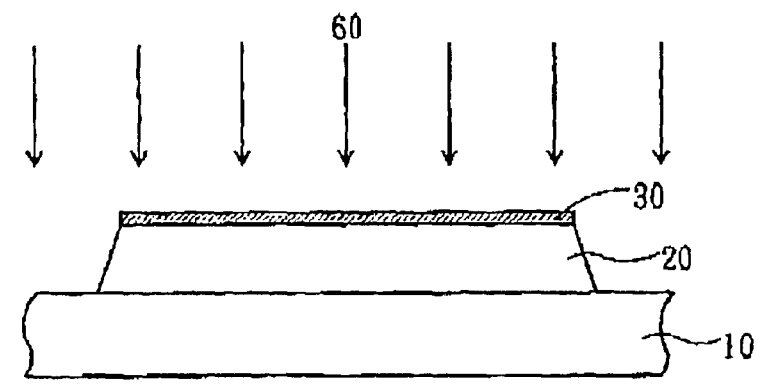
FIG. 2 is a schematic diagram of one preferred embodiment in the present invention, that a plasma atmosphere is employed to clean the surface of the gate electrode double-layer made AlNd or AlNd silicide.

FIG. 2 shows the gate electrode structure of a thin film transistor in one preferred embodiment of the present invention. The first metal layer 20 is formed on the glass substrate 10 and a second metal layer 30 is formed on the first metal layer 20. The first metal layer 20 and the second metal layer 30 are as barrier layers and oxides and residual impurities on the surface thereof are cleaned away, preferably with He plasma. In general, the material of the first metal layer 20 is Al or Al alloy, preferably AlNd, for providing lower gate impedance.

But an oxide is formed the surface of Al/Al alloy when Al/Al alloy is moved out a vacuum deposition chamber, the following processes or the impedance between the gate electrode and other metal layer formed with the following processes is influenced. Therefore, the second metal layer 30 is also formed on the first metal layer 20 in the same vacuum deposition chamber. The forming step is implemented under vacuum and so the generation of oxide can be avoided for reducing electrical problems thereof (i.g.: a higher contact impedance). The material of the second metal layer 30 is preferably Cr or Cr silicide and the thickness range of the second metal layer 30 is preferably 5–30 nm, more preferably 10–14 nm.

Then, the pattern transfer of the gate electrode of the thin film transistor is implemented to definite the etching pattern of the first metal layer 20 and the second metal layer 30. Due to the etching rate of the AlNd and Cr, or AlNd and Cr silicide are similar, the eaves structure will not be generated in the following processes and so a trapezoid gate electrode can be formed. Hence, the present invention can avoid the generation of the eaves structure resulted from different etching rate.

The etched gate electrode of the thin film transistor is placed on the mechanism of CVD (Chemical Vapor Deposition). Then, the AlNd layer and Cr layer, or the AlNd layer and Cr silicide layer are as the barrier layer to clean away the oxides and residual impurities by employing He plasma 60. Hence, the contact impedance of the gate electrode can be reduced.

Figure 3:
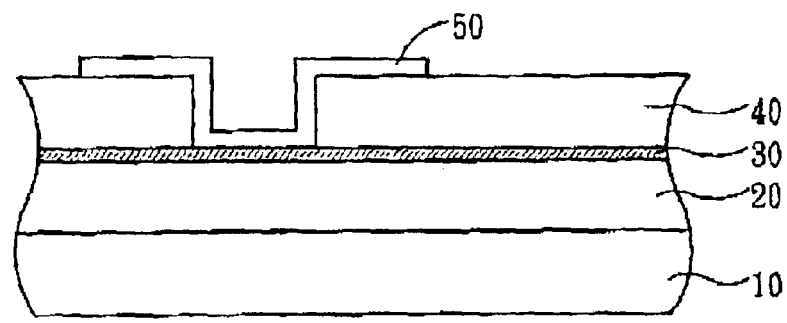
FIG. 3 is a schematic diagram of one preferred embodiment in the present invention, that the gate electrode double-layer made AlNd or AlNd silicide electrically connects with the ITO layer through a opening.

FIG. 3 shows the gate electrode of the thin film transistor according to the present invention. The insulator layer 40 is formed on the gate electrode of the thin film transistor and an opening is in the insulator layer 40. Then, the ITO layer 50 (Indium Tin Oxide) formed on the insulator layer 40 covers the opening, and electrically connects with the second metal layer 30 through the opening.

In the inventors' laboratory, the double-layer formed accroding to the present invention can efficiently reduce 60%–80% contact impedance compared with a typical double-layer of AlNd/AlNdN. Hence, the gate electrode formed according to the present invention can provide a shorter RC delay time, especially for a large size (more than 20") TFT that requires a shorter RC delay time.

As aforementioned, the present invention discloses a method for reducing contact impedance of thin film transistor. The method comprises forming a metal conducting structure on a substrate, the metal conducting structure, and employing plasma to clean surfaces of the metal conducting structure.

Wherein, the forming method of the metal conducting structure comprises forming an AlNd layer on the substrate, and forming a Cr layer or a Cr silicide layer on the AlNd layer for providing a lower gate impedance. The contact impedance also can be reduced by employing a plasma atmosphere to clean surfaces of the metal conducting structure whereby the AlNd layer and the Cr or Cr silicide layer are as barrier layers. Hence, it can be avoided that the gate electrode of the TFT is, made of single-layer Al or double-layer of Al/Al alloy or Al alloy/other metals has problems of a higher contact impedance and a higher gate impedance in the conventional arts. It also can be avoided that the gate electrode made of Cr or other metal has smaller contact impedance but higher gate impedance. Therefore, the present invention can achieve the purpose of shorter RC delay time.

Although specific embodiments have been illustrated and described, it will be obvious to those skilled in the art that various modifications may be made without departing from what is intended to be limited solely by the appended claims.

What is claimed is:

1. A method for reducing contact impedance of a thin film transistor, said method comprising:
   forming a metal conducting structure on a substrate, wherein the step of forming said metal conducting structure comprises:
   forming an AlNd layer on said substrate;
   forming a Cr layer on said AlNd layer; and
   employing a plasma atmosphere to clean surfaces of said AlNd layer and said Cr layer whereby said AlNd layer and said Cr layer are formed as barrier layers.

2. The method in claim 1, wherein said substrate is a glass substrate.

3. The method in claim 1, wherein said method further comprises forming an insulator layer on said surfaces of said AlNd layer and said Cr layer, wherein said insulator layer has an opening and a metal conducting layer electrically connects with said metal conducting structure through said opening.

4. The method in claim 3, wherein said metal conducting layer is an ITO layer.

5. The method in claim 1, wherein said plasma atmosphere is a He plasma atmosphere.

6. The method in claim 1, wherein said AlNd layer and said Cr layer are formed in the same deposition chamber.

7. The method in claim 1, wherein a thickness range of said Cr layer is 10 nm–14 nm.

8. The method in claim 1, wherein said metal conducting structure is a gate electrode of said thin film transistor.

9. The method in claim 1, wherein said metal conducting structure is trapezoid in shape.

10. A method for reducing contact impedance of thin film transistor, said method comprising:
    forming a metal conducting structure on a substrate, wherein forming said metal conducting structure comprises:
    forming an AlNd layer on said substrate;
    forming a Cr silicide layer on said AlNd layer; and
    employing a plasma atmosphere to clean surfaces of said AlNd layer and said Cr silicide layer whereby said AlNd layer and said Cr silicide layer are formed as barrier layers.

11. The method in claim 10, wherein said substrate is a glass substrate.

12. The method in claim 10, wherein said method further comprises forming an insulator layer on said surfaces of said AlNd layer and said Cr silicide layer, wherein said insulator layer has an opening and a metal conducting layer electrically connects with said metal conducting structure through said opening.

13. The method in claim 12, wherein said metal conducting layer is an ITO layer.

14. The method in claim 10, wherein said plasma atmosphere is a He plasma atmosphere.

15. The method in claim 10, wherein said AlNd layer and said Cr silicide layer are formed in the same deposition chamber.

16. The method in claim 10, wherein a thickness range of said Cr silicide layer is 10 nm–14 nm.

17. The method in claim 10, wherein said metal conducting structure is a gate electrode of said thin film transistor.

* * * * *